United States Patent
O et al.

(10) Patent No.: US 7,326,998 B1
(45) Date of Patent: Feb. 5, 2008

(54) EFFECTIVE I/O ESD PROTECTION DEVICE FOR HIGH PERFORMANCE CIRCUITS

(75) Inventors: Hugh Sungki O, Fremont, CA (US); Chih-Ching Shih, Pleasanton, CA (US); Cheng-Hsiung Huang, Cupertino, CA (US); Yow-Juang Bill Liu, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 11/185,609

(22) Filed: Jul. 19, 2005

Related U.S. Application Data

(60) Continuation-in-part of application No. 10/882,874, filed on Jun. 30, 2004, now Pat. No. 7,195,958, which is a division of application No. 10/298,104, filed on Nov. 14, 2002, now Pat. No. 6,777,721.

(51) Int. Cl.
    *H01L 23/62* (2006.01)
(52) U.S. Cl. ...................... 257/355; 257/365
(58) Field of Classification Search ............. 257/355, 257/365
    See application file for complete search history.

(56) References Cited

U.S. PATENT DOCUMENTS

| | | | |
|---|---|---|---|
| 5,486,716 A * | 1/1996 | Saito et al. ............ | 257/360 |
| 6,040,222 A * | 3/2000 | Hsu et al. ............. | 438/301 |
| 6,147,383 A * | 11/2000 | Kuroda .................. | 257/344 |
| 6,492,665 B1 * | 12/2002 | Akamatsu et al. ...... | 257/192 |
| 6,882,009 B2 * | 4/2005 | Ker et al. .............. | 257/349 |
| 2004/0043568 A1 * | 3/2004 | Ker et al. .............. | 438/279 |
| 2006/0001097 A1 * | 1/2006 | Nomura et al. ......... | 257/355 |

* cited by examiner

*Primary Examiner*—Douglas M. Menz
(74) *Attorney, Agent, or Firm*—Morgan, Lewis & Bockius LLP

(57) ABSTRACT

An integrated circuit is disclosed comprising at least one I/O pull-down device for protecting I/O logic circuits from electrostatic discharge (ESD). The turn-on voltage of the parasitic bipolar transistor in the I/O pull-down device is lowered by forming under a portion of the lightly doped drain (LDD) region of a first conductivity type of a conventional MOS transistor a second region of a second conductivity type. A P-N junction is formed between the second region and the source/drain regions. The turn-on voltage of the parasitic bipolar transistor in the I/O pull-down device can be reduced by at least 3 volts from that of a comparable device that does not practice the invention and can be varied by varying the concentration of the dopant. A method for forming the circuit including a process for recovering the current of the I/O pull-down device and its advantages are also disclosed.

12 Claims, 4 Drawing Sheets

EFFECTIVE I/O ESD PROTECTION DEVICE FOR HIGH PERFORMANCE CIRCUITS

CROSS-REFERENCE TO RELATED APPLICATIONS

This application is a continuation-in-part of application Ser. No. 10/882,874 filing date Jun. 30, 2004 which is a divisional of application Ser. No. 10/298,104, now U.S. Pat. No. 6,777,721, all of which are incorporated herein by reference.

BACKGROUND OF THE INVENTION

I/O pull-down devices have regularly been used to protect I/O logic circuits from electrostatic discharge (ESD). One such I/O pull-down device 100 is shown in FIG. 1. Device 100 comprises a P-well or P-type substrate 110 having P+ taps or contacts 120, a polysilicon gate 130 on the substrate and insulated therefrom by gate oxide 140, heavily doped N-type source and drain regions 150, 160, and N-type lightly doped drain (LDD) regions 170, 180 extending toward each other in the substrate from the source and drain regions. A parasitic NPN bipolar transistor is formed in this device in which the source and drain regions 150, 160 are the emitter and collector of the transistor and the P-well or substrate 110 is the base. The structure of a typical I/O logic circuit is similar to that of device 100 and is typically formed in the same integrated circuit as I/O pull-down device 100.

As device dimensions get smaller and smaller, it becomes increasingly more difficult to use such I/O pull-down devices to protect I/O logic circuits. The turn-on-voltage for the parasitic bipolar device in both the I/O pull-down circuit and the I/O logic circuit increases as the spacing between the P+ taps and the N+ diffusion decreases. In a practical design, a group of I/O transistors share common P+ taps for minimizing the circuit area; and the spacing between the farthest logic transistor and its P+ taps can be larger than that between the I/O pull-down transistor and its P+ taps. As a result, the parasitic bipolar device for the logic transistor can trigger at a lower voltage than that for the I/O pull-down transistor. This can occur at the 90 nm node and nodes beyond that.

Various methods are used for reducing the trigger voltage of the I/O pull-down transistor. In U.S. Pat. No. 6,882,009 of M. Ker et al., P-type pocket implants are used next to the source/drain regions. However, since the P-type pocket implants are used throughout the circuit, this reduces the trigger voltage of both the pull-down transistors and the logic transistors. As a result, the I/O pull-down transistor may not be able to protect the I/O logic circuit. In addition, the P-type pocket implant can degrade the transistor performance by increasing its junction capacitance, and thereby reducing its speed, and can increase the transistor leakage. In M. Ker et al., "ESD Implantation for On-Chip ESD Protection with Layout Consideration in 0.18 um Salicided CMOS Technology," IEEE Transactions on Semiconductor Manufacturing, Vol. 18, No. 2, pp. 328-337 (May 2005), a P-type ESD implant is located vertically under the source-drain area. This, however, significantly increases the junction capacitance and affects the transistor performance. It also increases the transistor leakage.

SUMMARY OF INVENTION

In a preferred embodiment of the invention, the turn-on voltage of a parasitic bipolar transistor in the I/O pull-down device is lowered by forming under the lightly doped drain region of a first conductivity type in a conventional MOS transistor a second doped region of a second conductivity type. A P-N junction is formed between the drain/source region of the MOS transistor and the second doped region of a second conductivity type. The doping of this conductivity type is limited to a mask-defined region in the MOS transistor and is done with an angled implant so as to create the P-N junction with the drain/source region. The turn-on voltage of the parasitic bipolar transistor in the I/O pull-down device can be varied by varying the concentration of the dopant in the second doped region. In particular, the turn-on voltage of the I/O pull-down device of the present invention can be reduced by at least 3 volts from that of comparable I/O pull-down devices that do not incorporate the present invention. Advantageously, an additional light doping of the first conductivity type is done in the mask-defined region of the transistor affected by the doping of the second conductivity type to restore the transistor current to normal levels.

The mask limits the doping of the second conductivity type to a relatively small region under the lightly doped drain regions with the result that there is very little impact on the junction capacitance. In particular, we have found that if the second doped region is formed under about 25% of the lightly doped drain regions, the junction capacitance does not change by more than 1%. In addition, the mask limits the doping of the second conductivity type to the I/O pull-down transistors so that the I/O logic transistor area in the same integrated circuit does not receive the doping. As a result, the breakdown voltage of the drain/source junction of the I/O logic transistors is not affected.

In accordance with a preferred embodiment of the invention, the I/O pull-down device is formed by the following process steps. First, a gate is formed on a semiconductor substrate. Second, the substrate is lightly doped on both sides of the gate with a dopant of a first conductivity type. Third, a mask is formed and the substrate on both sides of the gate is angled-implanted through the mask with a dopant of a second conductivity type. Fourth, the substrate is lightly implanted with a dopant of the first conductivity type using the same mask as in the third step. Then, the substrate is heavily doped on both sides of the gate so as to form source and drain regions from which the lightly doped drain regions extend. In a typical application of the invention, the foregoing steps are used to form simultaneously numerous I/O pull-down devices and I/O logic circuits in each of a large number of integrated circuits on a wafer.

BRIEF DESCRIPTION OF DRAWING

These and other objects features and advantages of the invention will be more readily apparent from the following Detailed Description in which.

DETAILED DESCRIPTION

Figure 2:
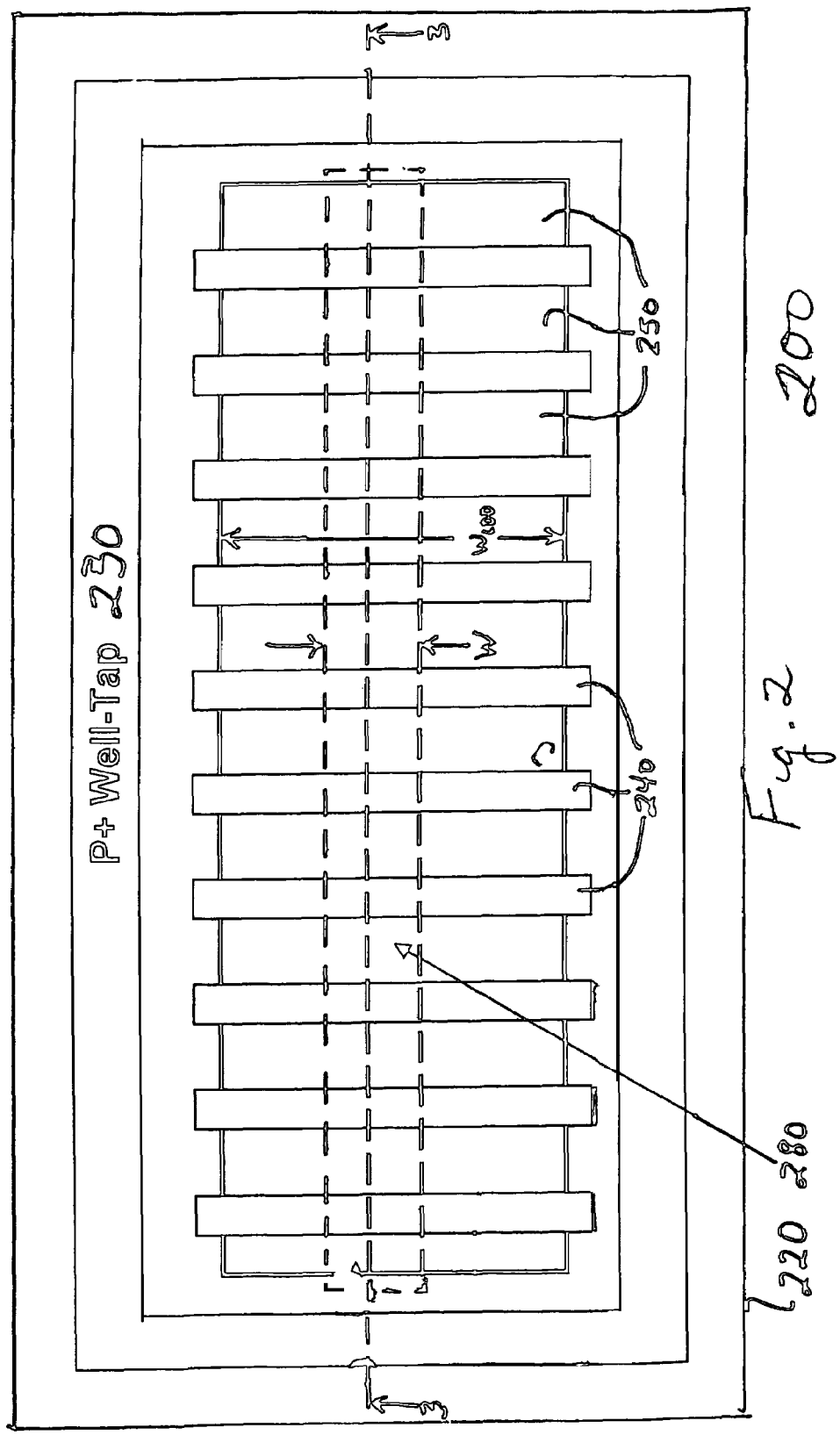
FIG. 2 is a top view of a preferred embodiment of the invention.

FIG. 2 is a top view of a preferred embodiment of an electrostatic discharge (ESD) protection device 200 of the present invention. Device 200 is formed in a portion of a semiconductor substrate 210. A P-well 220 is formed in that portion and electrical connection to the P-well is made through P+ well taps 230. Illustratively, the P-well tap extends around the entire periphery of P-well 220. An NMOS transistor is formed in the P-well having a plurality of gate fingers 240 and N+ source/drain regions 250 on both sides of the gate fingers. While not shown in FIG. 2, N-type lightly doped drain (LDD) regions extend toward each other from the source/drain regions 250 on both sides of each gate finger 240. In addition, underneath at least a portion of each N-type LDD region is a P-type region that forms a P-N junction with the drain/source region. In the embodiment of FIG. 2, the location of the P-type region and therefore the location of the P-N junction is indicated generally by the dashed rectangle 280. It will be understood, however, that the P-N junction does not extend under the gate fingers. The rectangular region 280 is shown to cover the center area of the transistors for illustrative purposes, although it can be anywhere in the transistors. Preferably, the width W of the rectangular region 280 is approximately 25% of the width $W_{LDD}$ of an LDD region although greater widths can be used as detailed below.

To avoid unnecessary complexity in FIG. 2, conventional contacts to the source/drain regions 250 and the connections of the gate fingers 240 have not been shown. These details will be evident to one skilled in the art.

Figure 1:
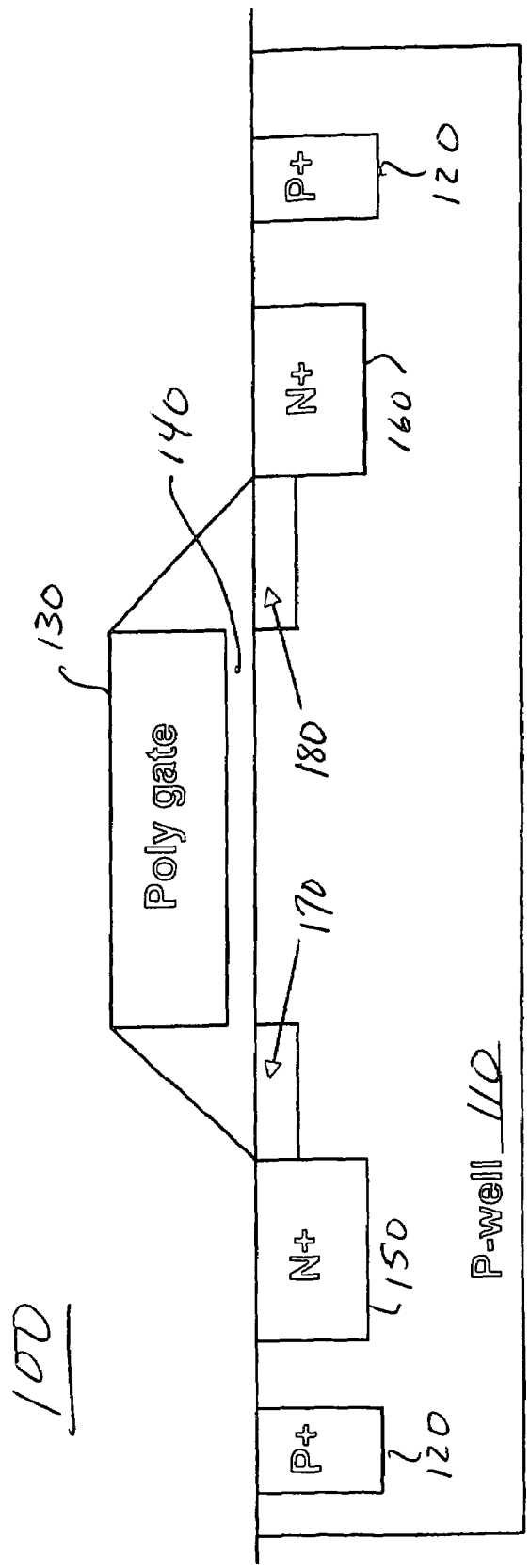
FIG. 1 is a cross-sectional view of a conventional I/O pull-down device.
Figure 3:
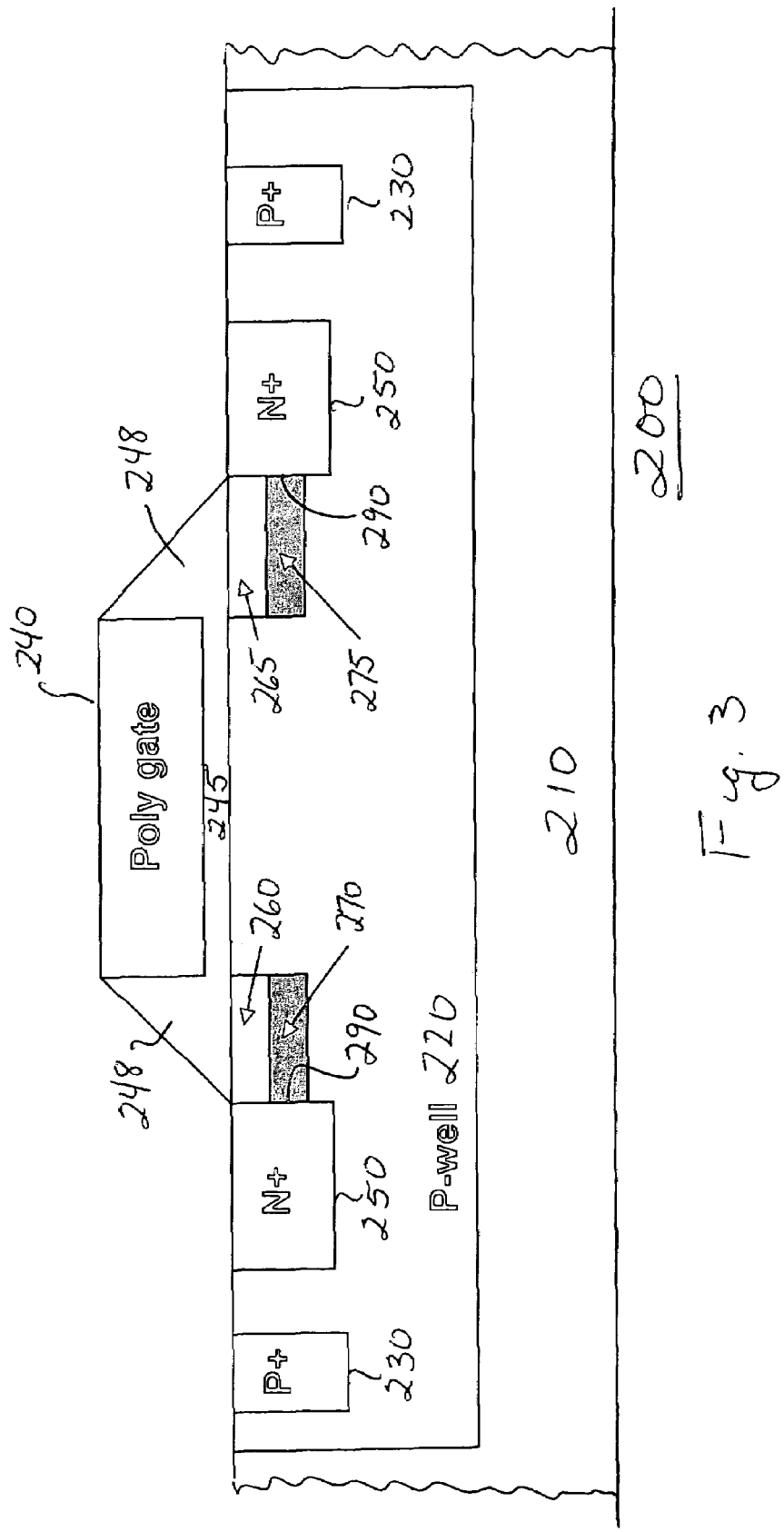
FIG. 3 is a cross-sectional view along line 3-3 of FIG. 2.

FIG. 3 depicts a cross-section of a portion of the ESD device 200 taken along lines 3-3 in the rectangular region 280 of FIG. 2. This cross-section depicts a single gate finger 240 and the source/drain regions 250 on either side of it. The structure of the other gate fingers and source/drain regions is identical. The structure of the ESD device in areas that are not under the rectangular region as well as the structure of the I/O logic circuits are similar to the structure depicted in FIG. 1. As shown in FIG. 3, device 200 comprises a P-well 220 in a substrate 210, P+ taps 230, gate finger 240 and heavily doped N+ source/drain regions 250. Gate finger 240 is insulated from P-well 220 in substrate 210 by gate oxide 245. The gate oxide includes sidewalls 248 on both sides of gate 240. Extending from each source/drain region toward the other source/drain region are first and second N-type lightly doped drain (LDD) regions 260, 265 and first and second P-type regions 270, 275. Between the P-type region and the drain/source region is a P-N junction 290. Illustratively, the P-type dopant is boron and the N-type dopant is phosphorous, arsenic or antimony; the concentration of the P-type dopant is in the range of approximately $1 \times 10^{15}$ to $1 \times 10^{17}$ atoms/cm$^3$; and the concentration of the N-type LDD dopant is in the range of approximately $1 \times 10^{13}$ to $1 \times 10^{15}$ atoms/cm$^3$. The P-type region extends to a depth of approximately a few thousand nanometers (nm) from the surface of the substrate; and the N-type LDD region extends to a depth of approximately a few hundred nm from the surface of the substrate.

A parasitic NPN bipolar transistor is formed in device 200 in which the heavily doped N+ source/drain regions function as the emitter and collector of the bipolar transistor and the P-well functions as the base. The turn-on voltage of this device, however, is determined by the doping concentrations of the P-type regions 270, 275. In particular, the turn-on voltage can be varied by varying the P-type doping concentrations.

Figure 4:
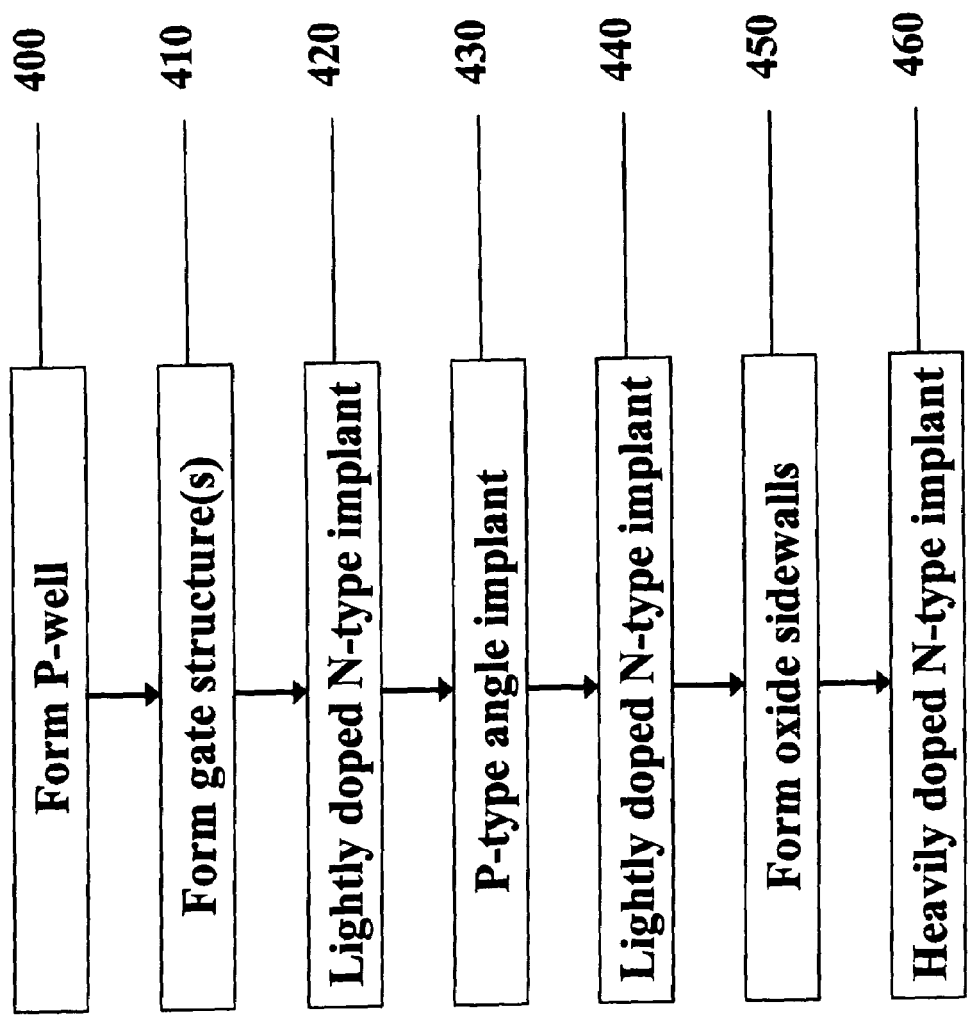
FIG. 4 is a flow-chart of a preferred method of making the device of FIG. 2.

An illustrative method for forming device 200 is shown in the flow chart of FIG. 4. At step 400, P-well 220 is formed in substrate 210; and at step 410, gate fingers are formed on an oxide layer. Both steps use conventional processes. Illustrative implant energies for forming the P-well are 50 to 100 keV. At step 420, a first lightly doped N-type implant is made using conventional processes. Illustrative implant energies are 20 to 50 keV. At step 430, a photolithographic mask is formed and an angled P-type implant is made through a region defined by the mask. Illustratively, the region defined by the mask is limited to the area bounded by rectangle 280 in FIG. 2 and the width of the region is approximately 25% of the width of the LDD region. Typical implant energies are 50 to 150 keV. As a result, the P-type implant is located under a portion of the N-type implant defined by the region in the mask. Since the gate fingers also mask the region of the P-well underneath the fingers, the P-type implant does not extend across the fingers.

In order to minimize the impact of the P-type implant on the transistor current, an additional light implant is preferably done with an N-type dopant. In particular, at step 440, an additional lightly doped N-type implant is made using the same photolithograph mask and conventional processes to compensate the P-type implant. Illustrative implant energies are 20 to 50 keV. Again, since the gate fingers mask the regions under the fingers, the implant does not reach the regions under the fingers. If the P-type implant were done to the entire I/O circuit, the saturation current for the I/O logic and I/O pull-down transistors would be reduced by as much as 60% of what it otherwise would be in some FPGA designs. However, when a lightly doped N-type implant is made following the P-type implant in the I/O pull-down transistors as in the present invention, the saturation current remains the same for the I/O logic transistors; and for the cases where the two implants are limited to 50% and 25% of the width of the LDD region, the saturation current decreases by less than 5% and less than 2.5%, respectively, for the I/O pull-down transistors.

After these implants, the oxide sidewalls 248 of the gate are formed at step 450 using conventional techniques. A heavily doped N-type implant is then made at step 460 to form the source/drains regions. Since the gate and the sidewalls mask the portion of the substrate underneath them, the implant is limited to a narrower region between the fingers than the lightly doped implants. As a result, the lightly doped regions remain in the region underneath the sidewalls.

The P-type implant is totally compensated in the drain/source regions and only uncompensated under the lightly doped N-type implant regions. The drain/source regions form N+/P junctions with the P-type implant located under the lightly doped N-type regions. As noted above, these junctions reduce the turn-on voltage of the I/O pull-down device. In particular, the turn-on voltage of the I/O pull-down device can be reduced by at least 3 volts from that of a comparable I/O pull-down device that does not incorporate the present invention. However, since the P-type implant is limited to the rectangular region 280 and there is no P-type implant under the drain/source regions, the effect on junction capacitance and the junction leakage is greatly reduced. In particular, if the N+/P junction were formed under the entire width of the LDD region in the entire I/O circuit, the junction capacitance would increase by nearly 8% in some FPGA designs. However, if the N+/P junction is formed only in the I/O pull-down transistors, the junction capacitance decreases considerably. We have found that where the N+/P junction is formed under only 25% of the width of the LDD region, the junction capacitance increases by no more than 1% and even if the N+/P junction is formed under as much as 50% of the entire width of the LDD region, the junction capacitance increases by less than 2%. With the current invention, the I/O leakage is kept low at a few nano-ampere or below. Thus, the advantages of the invention are realized with only a small increase in capacitance where the N+/P junction is formed under more than 50% of the width of the LDD region.

The mask also limits the P-type implant so that it is made only in the I/O pull-down transistor and not in the I/O logic transistors. As a result, the trigger voltage is only reduced in the I/O pull-down transistors and not in the I/O logic transistors. This allows the I/O pull-down transistor to trigger earlier in order to protect the I/O logic transistors.

As will be apparent to those skilled in the art, numerous variations may be made within the spirit and scope of the claims. In particular, the invention may also be practiced in PMOS transistors using N-wells, P+ source/drain regions, P-type LDD regions and N-type implants under the LDD regions.

What is claimed is:

1. An integrated circuit comprising at least one I/O logic circuit and at least one electrostatic discharge (ESD) protection device formed in a substrate having a first conductivity type, said logic circuit and said ESD protection device each comprising:
   a gate on the substrate and insulated therefrom,
   first and second heavily doped regions having a second conductivity type located in the substrate on opposite sides of the gate and forming source and drain regions; and
   first and second lightly doped drain (LDD) regions having a second conductivity type located in the substrate on opposite sides of the gate and extending from one of the heavily doped regions toward the other heavily doped region;
   wherein said ESD protection circuit further comprises a region of first conductivity type located under a portion of the LDD regions of the ESD protection device but not under any portion of the first and second LDD regions of the I/O logic circuit, said region of first conductivity type forming a P-N junction with an adjacent source/drain region under no more than approximately 50% of the width of the LDD regions.

2. The integrated circuit of claim 1 wherein the first and second heavily doped regions and the first LDD region have N-type conductivity.

3. The integrated circuit of claim 1 wherein the P-N junction is formed under a central portion of the first LDD region.

4. The integrated circuit of claim 1 wherein the P-N junction is formed under approximately 25% of the width of the LDD regions.

5. An integrated circuit comprising at least one I/O logic circuit and at least one electrostatic discharge (ESD) protection device formed in a substrate having a first conductivity type, said logic circuit and said ESD protection device each comprising:
   a gate on the substrate and insulated therefrom;
   first and second heavily doped N-type regions in the substrate on opposite side of the gate and forming source and drain regions;
   a first N-type lightly doped drain (LDD) region extending from the first N-type region toward the gate; and
   a second N-type LDD region extending from the second N-type region toward the gate
   wherein said ESD protection circuit further comprises a P-type region located under a portion of the first N-type LDD region of the ESD protection device but not under any portion of the LDD regions of the I/O logic circuit, said P-type region forming a P-N junction with the first heavily doped N-type region under no more than approximately 50% of the width of the LDD region.

6. The integrated circuit of claim 5 wherein the P-type region is under both the first and the second N-type LDD regions.

7. The integrated circuit of claim 5 wherein the P-type region is formed under a central region of the first N-type lightly doped drain region.

8. The integrated circuit of claim 5 wherein the P-N junction is formed under approximately 25% of the width of the LDD regions.

9. An electrostatic discharge (ESD) protection device formed in a substrate having a first conductivity type, said device comprising:
   a gate on a substrate and insulated therefrom;
   first and second heavily doped regions having a second conductivity type located in the substrate on opposite sides of the gate and forming source and drain regions;
   first and second lightly doped drain (LDD) regions having a second conductivity type located in the substrate on opposite sides of the gate and extending from one of the heavily doped regions toward the other heavily doped region; and
   a region of first conductivity located under no more than approximately 50% of the width of the LDD regions and forming a P-N junction with an adjacent source/drain region.

10. The ESD device of claim 9 wherein the first and second heavily doped regions and the LDD regions have N-type conductivity.

11. The ESD device of claim 9 wherein the P-N junction is formed under a central portion of the LDD regions.

12. The ESD device of claim 9 wherein the P-N junction is formed under approximately 25% of the width of the LDD regions.

* * * * *